United States Patent [19]

Nakamura

[11] Patent Number: 4,470,873
[45] Date of Patent: Sep. 11, 1984

[54] METHOD OF MANUFACTURING MAGNETIC SENSOR COMPRISING AT LEAST TWO MAGNETORESISTIVE ELEMENTS

[75] Inventor: Shigekazu Nakamura, Ageo, Japan

[73] Assignee: Copal Company Limited, Tokyo, Japan

[21] Appl. No.: 556,290

[22] Filed: Nov. 30, 1983

[30] Foreign Application Priority Data

Nov. 30, 1982 [JP] Japan ................. 57-209583

[51] Int. Cl.$^3$ ............ C23F 1/02; B44C 1/22; C03C 15/00; C03C 25/06
[52] U.S. Cl. ......................... 156/640; 156/646; 156/653; 156/656; 156/657; 156/659.1; 156/661.1; 252/79.1; 365/8; 365/32; 427/130; 427/131; 430/313; 430/316; 430/317; 430/318
[58] Field of Search ........... 156/640, 643, 646, 653, 156/656, 657, 659.1, 661.1, 668; 427/130, 131, 132; 204/192 EC, 192 E; 365/8, 32; 29/602 R, 604, 610 R; 252/79.1, 79.3, 79.5; 430/313, 316, 317, 318

[56] References Cited

U.S. PATENT DOCUMENTS

| | | | |
|---|---|---|---|
| 4,187,553 | 2/1980 | Ahn et al. | 427/131 X |
| 4,272,348 | 6/1981 | Cox et al. | 156/656 X |
| 4,299,680 | 11/1981 | Fontana et al. | 427/131 X |
| 4,334,951 | 6/1982 | Wagner | 156/656 X |
| 4,358,339 | 11/1982 | Oeffinger et al. | 156/659.1 X |

OTHER PUBLICATIONS

IBM Technical Disclosure Bulletin, vol. 18, No. 12, May 1976, pp. 4212–4213, Single Exposure Bubble Device Fabrication, by K. Y. Ahn.
IBM Technical Disclosure Bulletin, vol. 18, No. 10, Mar. 1976, pp. 3508–3509, High-Yield Process for Single-Level Mask Bubble Devices, by K. Y. Ahn et al.

Primary Examiner—William A. Powell
Attorney, Agent, or Firm—Stevens, Davis, Miller & Mosher

[57] ABSTRACT

A magnetic sensor including first and second electromagnetic elements arranged one on the other is manufactured by depositing on a glass substrate a first magnetoresistive film of Fe-Ni permalloy, an insulating film of SiO$_2$ and a second magnetoresistive film of Fe-Ni permalloy successively in this order and then these three films are simultaneously etched by a single etching treatment with aid of a photomask to form first and second magnetoresistive elements. Then, through-holes are formed in the second magnetoresistive film and insulating film to expose parts of the first magnetoresistive film. Next, an insulating photoresist film of polyimide is applied on the second magnetoresistive film and openings are formed in the insulating photoresist film at positions of the bottom of the through-holes and at positions corresponding to junctions to the second magnetoresistive film. After applying a metal film on the insulating photoresist film, the metal film is etched to form a conductor pattern serving as electrode conductors connected to the first and second magnetoresistive elements.

18 Claims, 30 Drawing Figures

FIG_1A

FIG_1B

FIG_2

FIG_14A

FIG_14B

FIG_14C

FIG_14D

METHOD OF MANUFACTURING MAGNETIC SENSOR COMPRISING AT LEAST TWO MAGNETORESISTIVE ELEMENTS

BACKGROUND OF THE INVENTION

The present invention relates to a method of manufacturing a magnetic sensor comprising at least two magnetoresistive elements arranged one on the other. Such a magnetic sensor is used for detecting a magnetization pattern recorded on an encoder such as linear encoder and rotary encoder or for reading out information recorded on a magnetic record medium such as magnetic tape and magnetic disc.

In Japanese Patent Application Publication Nos. 37,204/78 and 37,205/78, there has been disclosed a known magnetic sensor comprising two magnetoresistive elements (hereinafter abbreviated as MR element) arranged on respective side of an insulating film and magnetically biased with each other. In such a known magnetic sensor, a first electroresistive film (hereinafter abbreviated as MR film) is applied on an insulating substrate, then an insulating film is applied on the first MR film and finally a second MR film is applied on the insulating film. In such a construction, in order to obtain a stable detection output, the first and second MR elements should have identical magnetic properties with each other. In the known method of manufacturing the magnetic sensor, after the first MR film and a first electrode film have been deposited on the insulating substrate successively, these films are etched in accordance with a given pattern. Then after the insulating film, the second MR film and a second electrode film have been deposited, these films are subjected to an given patterning treatment. However, such a known manufacturing method requires several deposition and photoetching processes, and thus, there is a drawback that the manufacturing process becomes complicated. Further, since the first and second MR films are formed into the given patterns by means of separate etching steps, the accuracy of dimension and shape could not be maintained, so that the magnetic properties of the MR elements become different from each other. Moreover, in case of forming electrical connections to the first and second MR elements, there might be easily produced undesired short-circuits.

SUMMARY OF THE INVENTION

The present invention has for its object to provide a novel and useful method of manufacturing a magnetic sensor comprising at least two magnetoresistive elements whose magnetic properties are identical with each other.

It is another object of the invention to provide a method of manufacturing a magnetic sensor comprising at least two magnetoresistive elements in a simple and accurate manner.

It is still another object of the invention to provide a method of manufacturing a magnetic sensor including at least two magnetoresistive elements arranged one on the other, while undesired short-circuit between the magnetoresistive elements can be effectively avoided.

According to the invention, a method of manufacturing a magnetic sensor including at least two magnetoresistive elements arranged one on the other via an insulating layer comprises the steps of:

depositing on a substrate at least a first magnetoresistive film, an insulating film and a second magnetoresistive film successively in this order;

applying a resist film on the second magnetoresistive film;

selectively removing the resist film in accordance with a given pattern of the magnetoresistive elements to be manufactured;

etching simultaneously the first and second magnetoresistive films and insulating film via the resist film to form first and second magnetoresistive elements arranged one on the other with the insulating film being interposed therebetween;

forming in said second magnetoresistive film and insulating film through-holes extending up to the first magnetoresistive film; and forming an electrical connection to the first magnetoresistive film by means of said through-holes.

DESCRIPTION OF THE PREFERRED EMBODIMENTS

Figure 1A:
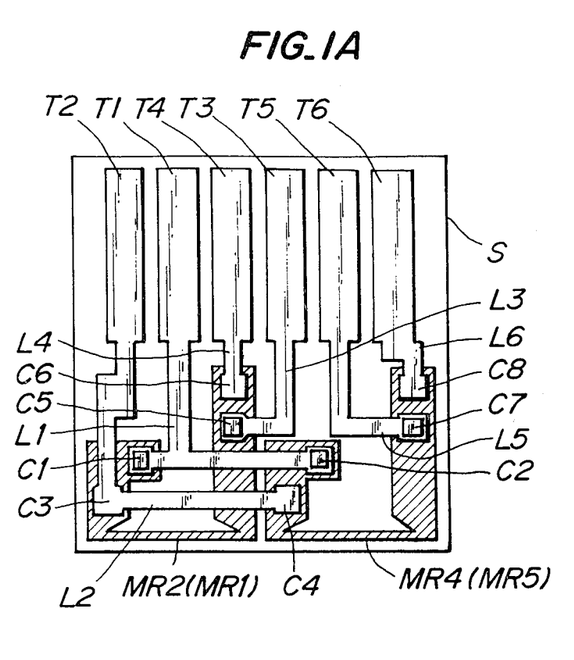
FIGS. 1A and 1B are schematic plan and perspective views, respectively showing a magnetic sensor to be formed by the method according to the invention.
Figure 1B:
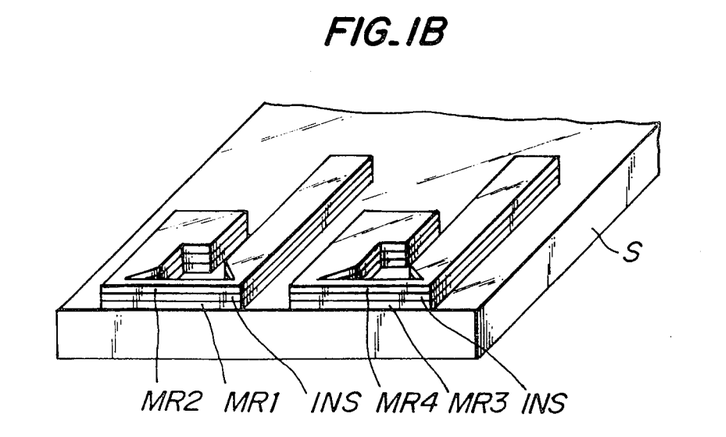

FIGS. 1A and 1B are schematic plan and perspective views, respectively of an embodiment of a magnetic sensor to be manufactured by the method according to the invention. For the sake of clearity, in FIGS. 1A and 1B, an upper insulating layer is omitted and in FIG. 1A MR films are denoted by hatchings. The magnetic sensor of the present embodiment comprises four magnetoresistive elements MR1 to MR4, and the MR elements MR2 and MR4 are arranged on the MR elements MR1 and MR3, respectively. The MR elements are formed on a glass substrate S and between the MR elements MR1 and MR2 and the MR elements MR3 and MR4 are interposed insulating films INS.

Figure 2:
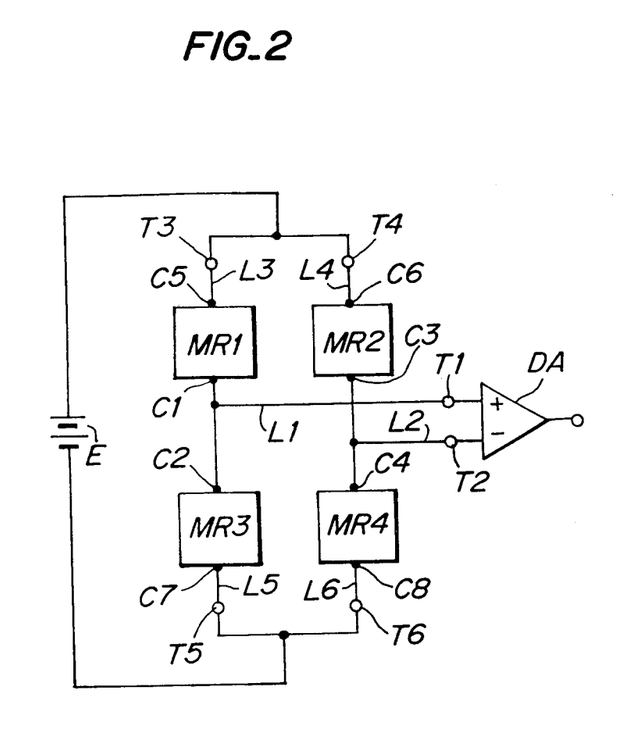
FIG. 2 is a circuit diagram of the magnetic sensor.

As shown in FIG. 2, the four MR elements MR1 to MR4 are connected to constitute a bridge circuit. That is to say, one ends of the lower MR elements MR1 and MR3 are connected to a conductor L1 at junctions C1 and C2, respectively and the conductor L1 is connected to a terminal T1. One ends of the upper MR elements MR2 and MR4 are connected to a conductor L2 at junctions C3 and C4, respectively and the conductor L2 is connected to a terminal T2. The other end of the MR element MR1 is connected to a terminal T3 via a junction C5 and a conductor L3, and the other end of the upper MR element MR2 is connected to a terminal T4 through a junction C6 and a conductor L4. The other end of the lower MR element MR3 is coupled with a terminal T5 by means of a junction C7 and a conductor L5, and the other end of the upper MR element MR4 is connected to a terminal T6 via a junction C8 and a conductor L6. In FIG. 1A, the junctions to the lower MR elements MR1 and MR3 are denoted by double frames. As illustrated in FIG. 2, the output terminals T1 and T2 of the bridge circuit are connected to differential inputs of a differential amplifier DA. The terminals T3 and T4 are commonly connected to a positive terminal of a supply voltage source E and the terminals T5 and T6 are commonly connected to a negative terminal of the supply voltage source E. Therefore, the terminals T3 and T4 and the terminals T5 and T6 may be a single terminal, respectively. However, in order to effect a short-circuit test of MR elements during the manufacture of the magnetic sensor, it is preferable to provide the separate terminals as shown in the drawings.

Now, examples of the method of manufacturing the magnetic sensor according to the invention will be explained in detail.

EXAMPLE I

Figure 3:
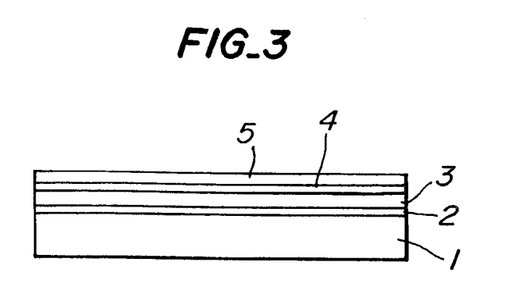
FIGS. 3 to 10 are schematic views illustrating successive manufacturing steps and photomasks for explaining a first example I of the manufacturing method according to the invention.

At first, as shown in FIG. 3, on a glass plate 1 were successively deposited a first MR film 2 made of permalloy of 81% Ni-19% Fe and having a thickness of 300 Å, an insulating film 3 made of silicon oxide ($SiO_2$) and having a thickness of 2,000 Å and a second MR film 4 made of permalloy and having a thickness of 300 Å. Then a photoresist film 5 of positive type was applied on the second MR film 4. During the deposition of the films, the substrate was kept at a temperature of 300° C. As the photoresist film 5, use was made of AZ-1350 for dry etching.

Figure 4:
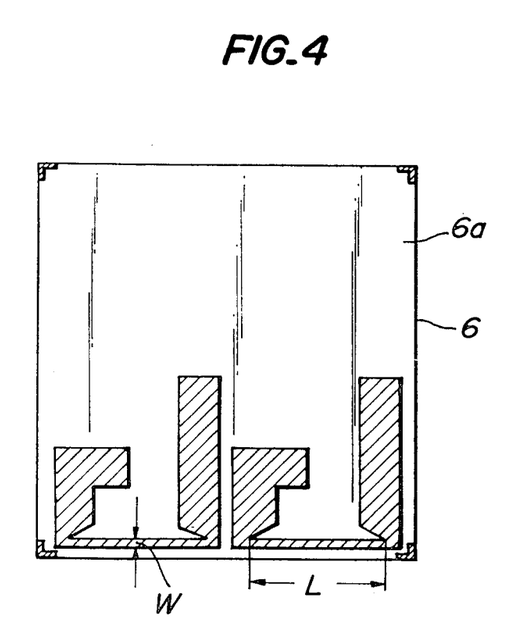

Next, the photoresist film 5 was subjected to selective light exposure by means of a photomask 6 shown in FIG. 4, the photomask having a given pattern corresponding to a pattern of MR elements to be formed. In case of using the positive type photoresist film 5, a portion of the film 5 exposed with light passing through a transparent portion 6a of the photomask 6 is not hardened and is washed away. In the present embodiment, a length L of the MR element is about 1 mm and a width W is 50 μm.

Next, a dry etching was effected by using a gas mixture including carbon tetrafluoride gas ($CF_4$), carbon tetrachloride gas ($CCl_4$) and oxygen gas ($O_2$) to etch away portions of the first and second MR films 2 and 4 and the insulating film 3 simultaneously. In this case, $CF_4$ gas serves to remove the insulating film 3, and $CCl_4$ gas serves to etch the Fe-Ni permalloy MR films 2 and 4, while $O_2$ gas serves to promote the etching of MR films. It should be noted that the simultaneous etching may be effected by a wet etching or a spatter etching in Ar gas. In case of the wet etching, the $SiO_2$ insulating film 3 may be removed by a hydrofluoric acid etchant and the Fe-Ni permalloy MR films may be etched by a mixed strong acid etchant. According to the invention, it is important to remove simultaneously the first and second MR films 2 and 4 and insulating film 3 by a single etching process. Then, the patterns of the upper and lower MR elements can be completely made identical with each other and thus, magnetic properties of these MR elements can be made precisely equal to each other. Further, the manufacturing process per se becomes simple. Moreover, the lower MR elements MR1 and MR3 and the upper MR elements MR2 and MR4 are formed from the first and second MR films 2 and 4, respectively and therefore, the thickness of the MR elements is made equal to each other, so that a difference in the magnetic properties of the MR elements becomes further small.

Figure 5:
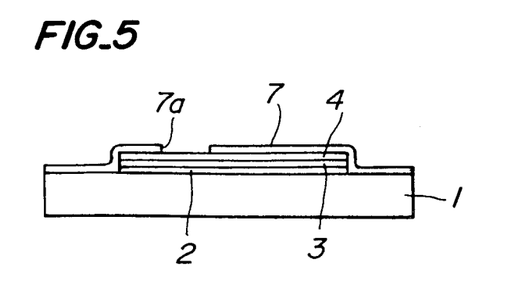
Figure 6:
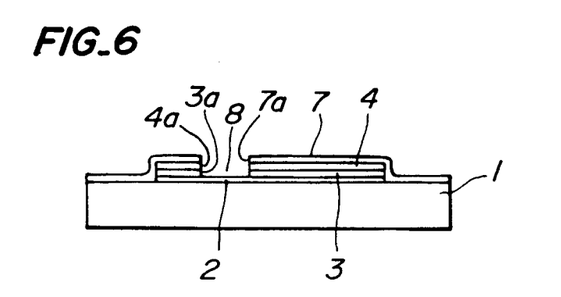

After removing the photoresist film 5 remained on the second MR film 4, a photoresist film 7 of negative type was newly formed as illustrated in FIG. 5. Next, in the photoresist film 7 there were formed openings 7a at positions corresponding to the junctions to the first MR film 2 with the aid of a suitable photomask (refer to FIG. 17). In FIG. 5 only one opening 7a is shown. Through the opening 7a was effected an etching treatment to form openings 4a and 3a in the second MR film 4 and insulating film 3, respectively so as to form a through-hole 8 extending up to the first MR film 2.

Figure 7:
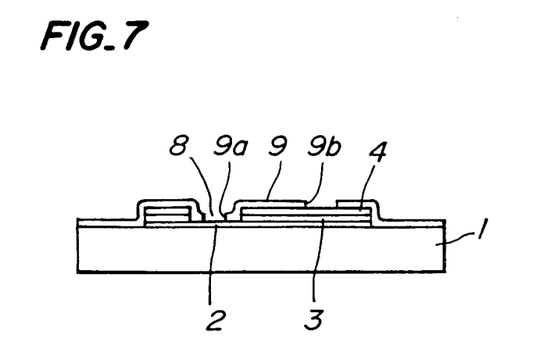
Figure 8:
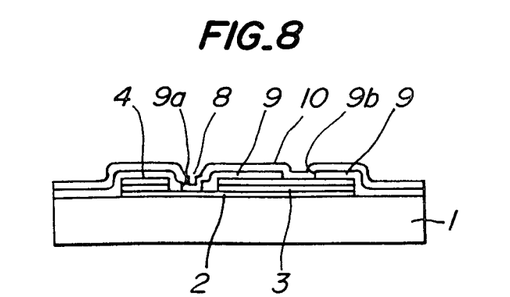

Next, as depicted in FIG. 7, an electrically insulating photoresistive film 9 of negative type was applied on the second MR film 4, and then an opening 9a was formed in the photoresist film 9 at a bottom of the through-hole 8. At the same time an opening 9b was formed in the photoresist film 9 at a portion corresponding to the junction to the second MR film 4. In this manner, the first and second MR films 2 and 4 were partially exposed. The insulating photoresist film 9 was made of polyimide which has a superior electrical insulating property. Next, without removing the insulating photoresist film 9, a metal film 10 made of double layer of molybdenum (Mo) and gold (Au) was deposited as shown in FIG. 10. The vapour deposition of the metal film 10 was effected in such a manner that the Mo and Au layers have thicknesses of 2,000 Å and 5,000 Å, respectively, while the substrate 1 was heated to a temperature of 250° C. Then after applying a photoresist film of positive type on the metal film 10, the metal film was selectively etched by means of a photomask 11 shown in FIG. 9 to obtain a desired pattern of conductor. During the etching, ceric ammonium nitrate etchant was used for the molybdenum layer and a potassium iodide etchant was use for etching the gold layer. Finally the photoresist film remained on the metal pattern was removed to obtain the magnetic sensor illustrated in FIG. 10.

As explained above, according to the invention, the first and second MR films 2 and 4 and the insulating film 3 sandwiched therebetween are simultaneously etched away, the dimensions and shapes of the first and second MR elements which are formed one on the other can be made precisely identical with each other, so that the magnetic properties of these MR elements become similar to each other and also the manufacturing process becomes simple and easy. Moreover, since the junction to the lower MR element is formed by applying the metal film on the photoresist film 9 through the opening 9a formed in the film 9, the short-circuit between the first and second MR films 2 and 4 can be effectively avoided.

EXAMPLE II

Figure 11:
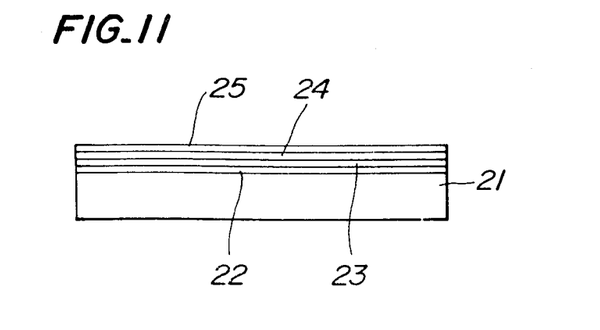
FIGS. 11 to 13 and FIGS. 14A to 14D are schematic views depicting successive steps of a second example II of the manufacturing method according to the invention.
Figure 12:
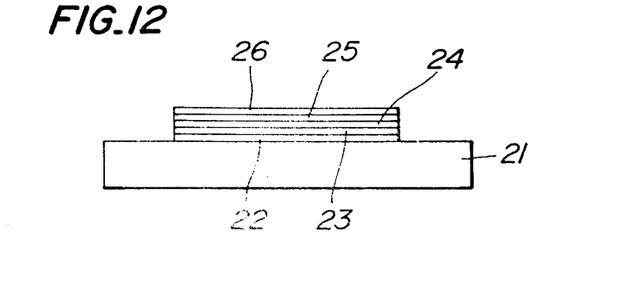
Figure 13:
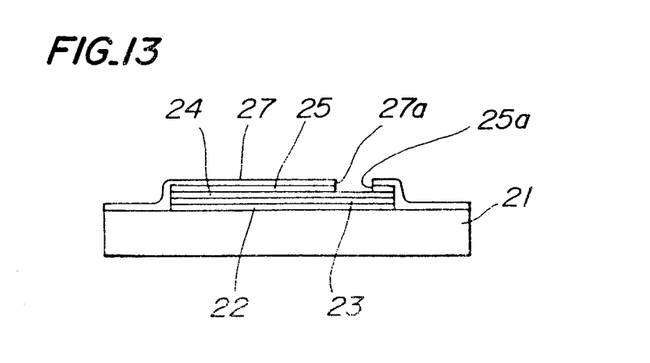

In this example, on a glass substrate 21 were successively deposited a first MR film 22 made of Ni-Fe permalloy, a first insulating film 23 made of $Ta_2O_5$, a second MR film 24 made of Ni-Fe permalloy and a second insulating film 25 made of $SiO_2$ as shown in FIG. 11. In the present embodiment, it is important to form the first and second insulating films 23 and 25 from different insulating materials. Next a photoresist film 26 of positive type was applied on the second insulating film 25 and then the photoresist film was partially etched by means of the photomask 6 shown in FIG. 4. Then, all the four films 22 to 25 were simultaneously etched by using the gaseous etchant including $CF_4$ gas, $CCl_4$ gas and $O_2$ gas to obtain an assembly shown in FIG. 12.

Then a photoresist film 27 was deposited and an opening 27a was formed in the photoresist film 27 at a position corresponding to the junction to the second MR film 25. After that, an opening 25a was formed in the second insulating film 25 by using an etchant which attacks the second insulating film made of $SiO_2$, but does not attack the first insulating film 23 made of $Ta_2O_5$. An example of such an etchant is a dydroflouric acid etchant. In the present example, since the selective etchant attacking $SiO_2$ is used, even if there are pinholes in the second MR film 24 and the etchant arrives at the first insulating film 23 through the pin-holes, the first insulating film is not etched away and therefore, the short-circuit between the first and second MR films 22 and 24 can be effectively avoided.

Figure 14A:
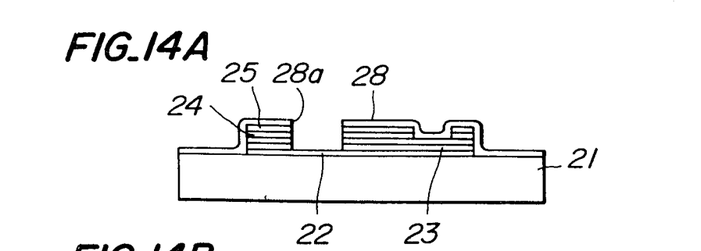
Figure 14B:
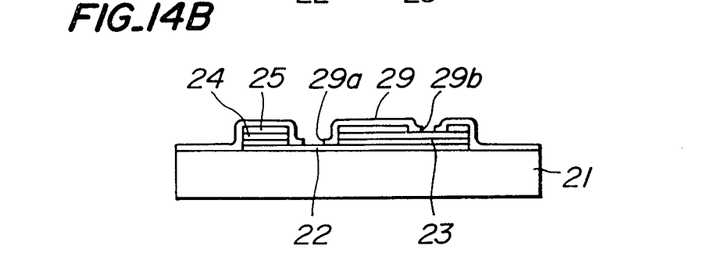
Figure 14C:
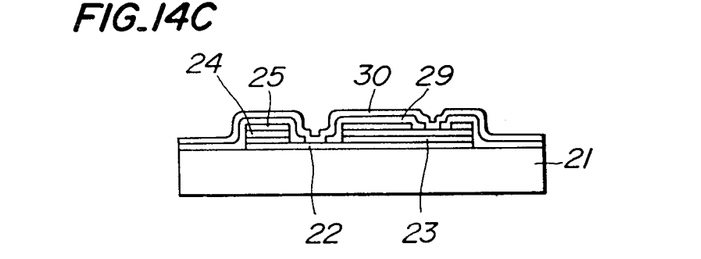
Figure 14D:
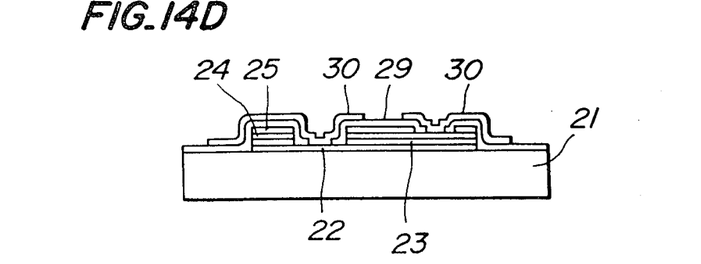

Then the assembly was treated by the similar steps as the previous example shown in FIGS. 5 to 10. That is to say, after applying a new photoresist film 28, an opening 28a was formed in the photoresist film 28 at a position corresponding to the junction to the first MR film 22 and then parts of the second insulating film 25, second MR film 24 and first insulating film 23 were removed to form a through-hole as illustrated in FIG. 14A. Then, after removing the photoresist film 28, an insulating photoresist film 29 was deposited and openings 29a and 29b were formed in the film 29 at positions corresponding to the junctions to the first and second MR films 22 and 24, respectively as illustrated in FIG. 14B. After applying a metal film 30 on the photoresist film 29 as depicted in FIG. 14C, the metal film 30 was selectively etched away with the aid of the photomask shown in FIG. 9 to form a metal pattern. Next, a photoresist film remained on the metal film 30 was removed to obtain the magnetic sensor shown in FIG. 14D.

In the present example, in addition to the advantages explained with reference to the example I, the following advantage can be obtained. In the present example, in order to form the junction to the upper MR film 24, the opening 25a is formed in the second insulating film 25 with the aid of the etchant which selectively attacks the second insulating film 25 made of $SiO_2$, but does not attack the first insulating film 23. Therefore, even if the etchant might be brought into contact with the first insulating film 23 via possible pin-holes in the second MR film 24, the first insulating film 23 could never be removed. This results in that the first and second MR films 22 and 24 are not short-circuited during the vapour deposition of the metal film 30.

EXAMPLE III

Figure 15:
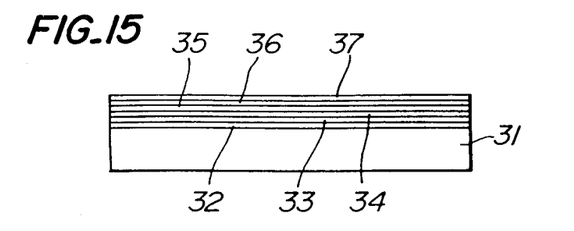
FIGS. 15 to 23 are schematic views illustrating successive steps and photomasks for explaining a third example III of the manufacturing method according to the invention.

In the present example, as illustrated in FIG. 15, on a silicon substrate 31 were successively applied a first insulating film 32 made of $Ta_2O_5$ and having a thickness of 500 Å, a first MR film 33 of 300 Å thick made of Ni-Fe permalloy, a second insulating film 34 of 1,500 Å thick and made of $SiO_2$, a third insulating film 35 of 500 Å thick made of $Ta_2O_5$, a second MR film 36 of 300 Å thick made of Ni-Fe permalloy and a fourth insulating film 37 of 1,500 Å thick made of $SiO_2$. The deposition of these six films 32 to 37 were effected, while the substrate 31 was heated to a temperature of 300° C.

Next after depositing a photoresist film of positive type, the six films 32 to 37 were simultaneously subjected to the patterning treatment with the aid of the photomask 6 shown in FIG. 4. The patterning treatment was carried out by means of the dry etching which utilizes a gas mixture containing $CF_4$ gas for removing the insulating films made of $SiO_2$ and $Ta_2O_5$, $CCl_4$ gas for attacking the MR films made of Fe-Ni permalloy and $O_2$ gas for promoting the action of $CCl_4$ gas.

By subjecting all the six films simultaneously to the etching treatment, the manufacturing process can be made very simple and the dimension and shape of the MR elements arranged one on the other can be made completely indentical with each other so that their magnetic properties can be made equal precisely.

Figure 16:
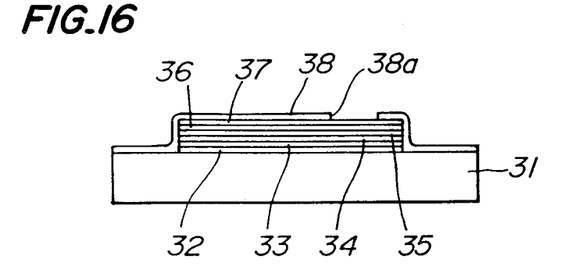
Figure 17:
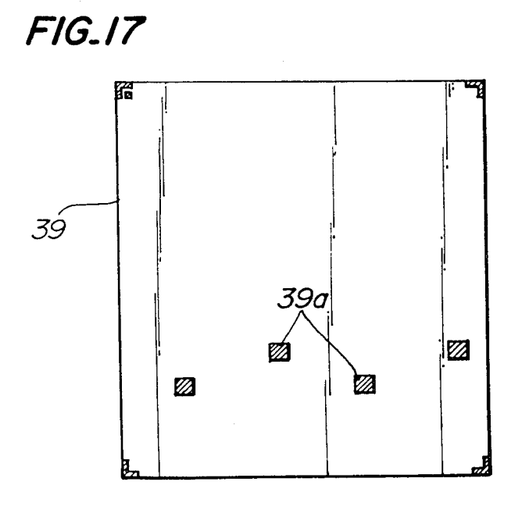

Next, as shown in FIG. 16, a photoresist film 38 of negative type was applied and then an opening 38a was fomred in the photoresist film 38 with the aid of a photomask 39 illustrated in FIG. 17, the photomask 39 having opaque portions 39a at positions corresponding to the junction points to the lower MR film 33.

Figure 18:
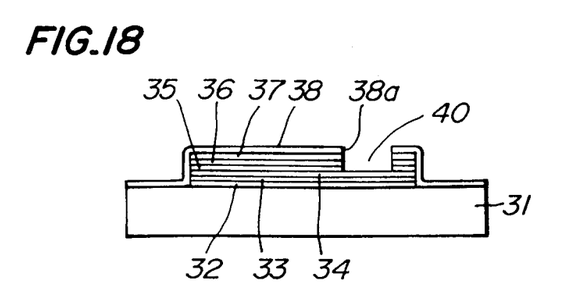

Next, the fourth insulating film 37, second MR film 36 and third insulating film 35 were partially etched away to form a through-hole 40 extending up to the second insulating film 34 as depicted in FIG. 18. Also in this case, the dry etching using the $CF_4$, $CCl_4$ and $O_2$ gas mixture was used. During this etching treatment, the second insulating film 34 may be etched more or less and thus, it is not necessary to control the etching process precisely. It should be noted that the etching may be effected by the wet etching. In such a case, hydrofluoric acid etchant may be used for attacking $SiO_2$, alkali etchant for $Ta_2O_5$ and mixed strong acid etchant may be used for etching Fe-Ni permalloy.

Figure 19:
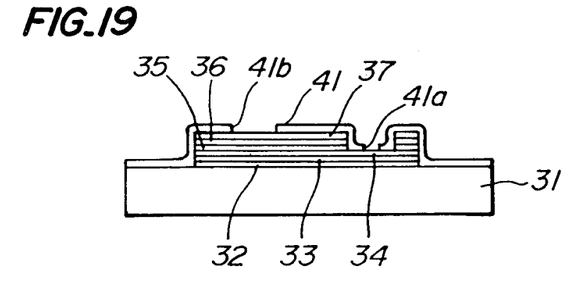
Figure 20:
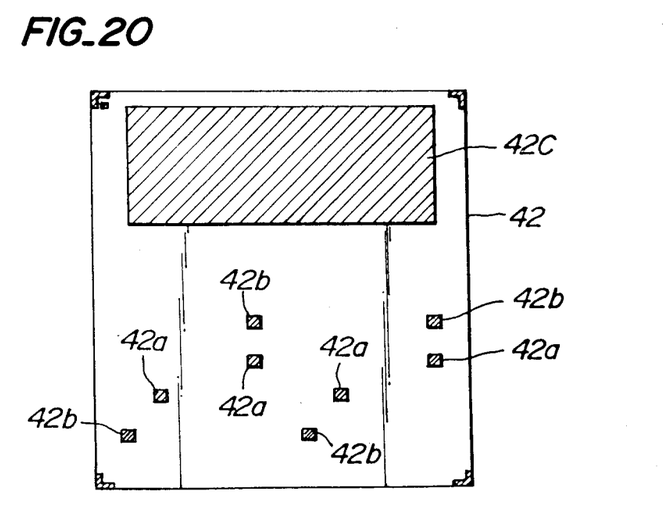

Next, a negative type insulating photoresist film 41 made of polyimide was applied after removing the residual photoresist film 38 as illustrated in FIG. 19 and openings 41a and 41b were formed in the film 41 with the aid of a photomask 42 shown in FIG. 20. The opening 41a is formed in the through-hole 40 and opaque portions of the photomask 42 corresponding to the opening 41a are denoed by a reference numeral 42a in FIG. 20. The remaining opaque portions 42b in the photomask 42 correspond to the opening 41b for forming the junction points to the upper MR film 36. The photomask 42 further comprises a relatively large rectangular opaque portion 42c which serves to remove a part of the insulating photoresist film 41 at a bonding position, however, in FIG. 19, an opening in the photoresist film 41 corresponding to the opaque portion 42c is not shown for the sake of simplicity.

Figure 21:
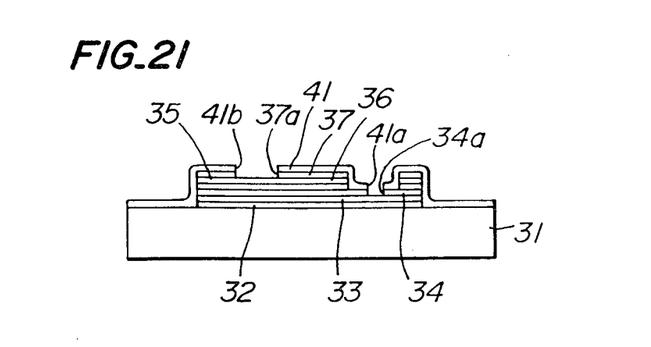

Next, as illustrated in FIG. 21, parts of the second and fourth insulating films 34 and 37 made of $SiO_2$ were selectively removed via the openings 41a and 41b, respectively by using a selective wet etchant which attacks $SiO_2$, buz does not attack $Ta_2O_5$. Such a selective wet etchant may be a hydrofluoric acid etchant such as $HF+6NH_4F$. By means of this selective etching treatment, holes 34a and 37a extending up to the first and second MR films 33 and 36, respectively were formed. Also in this example, since the selective etchant attaching $SiO_2$ selectively is used, it is possible to prevent effectively the first and second MR films 33 and 36 from being short-circuited via possible pin-holes.

Figure 22:
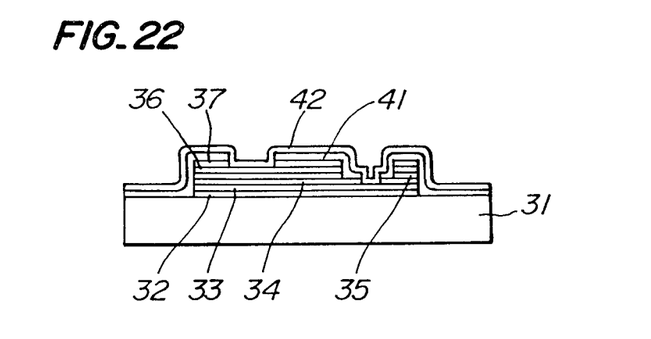

Next, as shown in FIG. 22, on the insulating photoresist film 41 was applied a metal film 43 made of a molybdenum layer of 2,000 Å thick and a gold layer of 5,000 Å thick, while the substrate 31 was kept at about 250° C.

Figure 9:
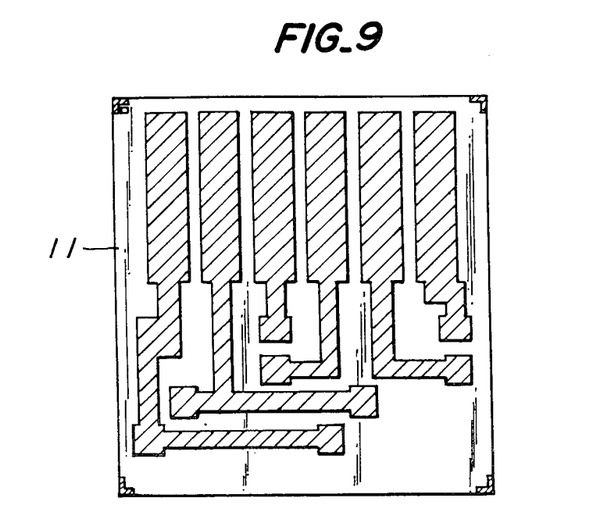
Figure 10:
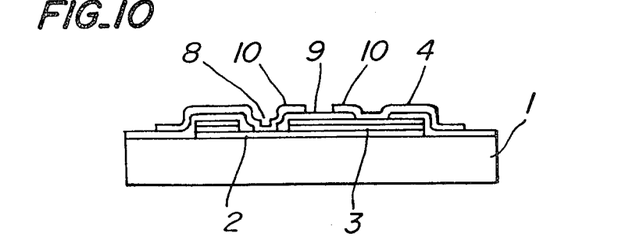
Figure 23:
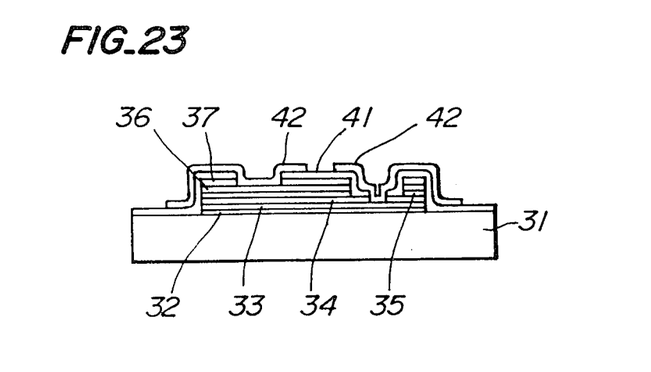

Next after depositing a photoresist film of positive type, the metal film 43 was etched into a given pattern shown in FIG. 23 with the aid of the photomask 11 illustrated in FIG. 9.

Figure 24:
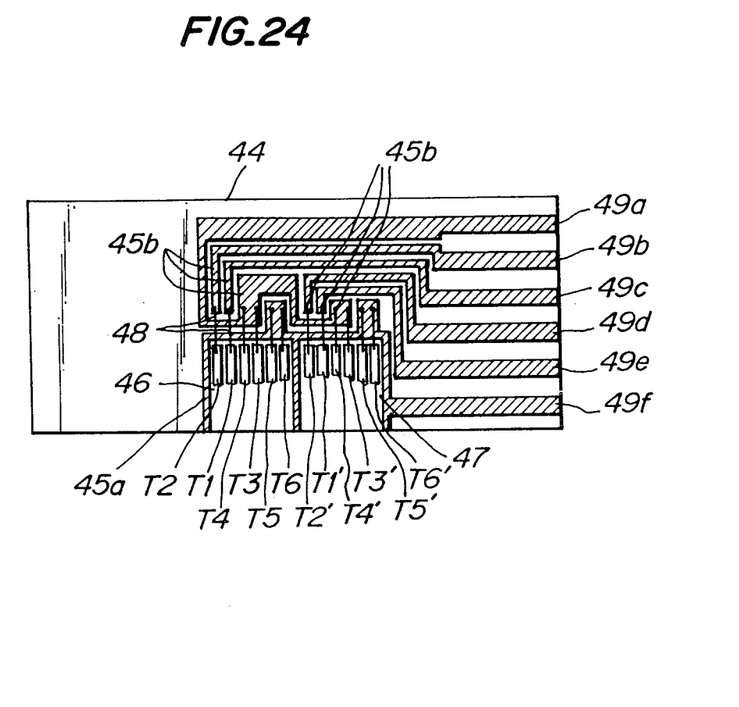
FIG. 24 is a plan view showing an encoder comprising the magnetic sensor manufactured by the method according to the invention.

Next, as shown in FIG. 24, magnetoresistive element chips 46 and 47 which were manufactured in the manner explained above were secured by bonding onto a metal part 45a of a board 44 comprising an insulating base plate made of glass epoxy, a Ni layer of 5 $\mu$m thick applied on the base plate and an Au layer of 1 $\mu$m thick applied on the Ni layer. Since the metal part 45a has a large area, a sufficient heat dissipation can be attained via the metal part. Each of the chips 46 and 47 comprises four MR elements and the terminals T1 to T6 and T1' to T6' are connected to conductor parts 45a and 45b of the board 44 by means of fine wires 48. In order to effect this wire bonding effectively, portions of the insulating photoresist film 41 which would situate under the terminals T1 to T6 and T1' to T6' have been previously removed as explained above with reference to the opaque portion 42C of the photomask 42 shown in FIG. 20.

Figure 25:
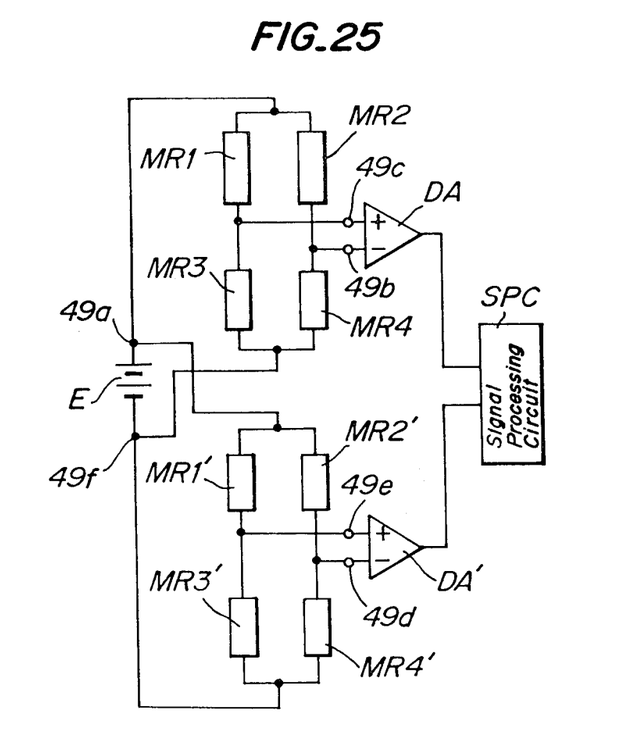
FIG. 25 is a circuit diagram of the encoder shown in FIG. 24.

The eight MR elements MR1 to MR4 and MR1' to MR4' formed in the chips 46 and 47 are connected into a bridge circuit shown in FIG. 25. That is to say, terminals 49a and 49f on the board 44 are connected to positive and negative input terminals, respectively of a supply voltage source E, terminals 49b and 49c are connected to inputs of a first differential amplifier DA and terminals 49d and 49e are connected to inputs of a second differential amplifier DA'. Outputs from the differential amplifiers DA and DA' are supplied to a signal processing circuit SPC and are processed therein.

Figure 26:
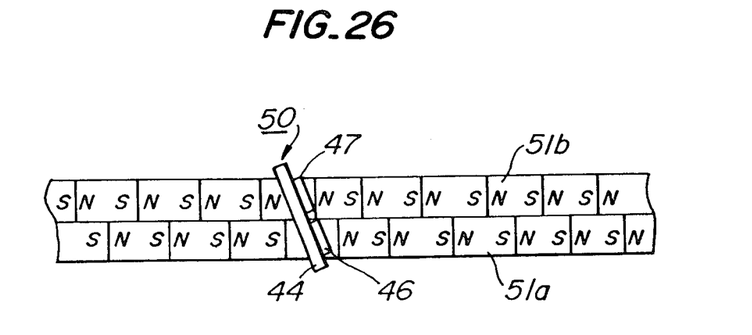
FIG. 26 is a plan view showing a positional relation between the magnetic sensor and magnetization patterns.

As illustrated in FIG. 26, the magnetic sensor 50 is used as an encoder and is arranged opposite to a magnetic recored medium in such a manner that the MR element chips 46 and 47 are opposed to magnetization patterns 51a and 51b recorded on the magnetic record medium with a given phase relationship. That is to say, the magnetic sensor 50 is inclined with respect to the direction into which the magnetization patterns 51a and 51b extend. Therefore, from the signal processing circuit SPC there is produced an output signal representing a direction and an amount of displacement between the magnetic sensor and the record medium.

The present invention is not limited to the embodiments explained above, but may be modified in various manner within the scope of the invention. In the abqve embodiments, SiO$_2$ and Ta$_2$O$_5$ are used as insulating material, but any other oxides, fluorides and nitrides such as MgF$_2$ and Si$_3$N$_4$ may be used. Moreover, the etching process may be effected by spatter etching in Ar gas instead of the dry etching and wet etching. Further, in the examples II and III, the uppermost insulating film is formed by the insulating photoresist film made of polyimide, but it is also possible to apply a separate insulating film after removing the photoresist film. In such a case, it is unnecessary to use the insulating photoresist film. In the above embodiments, the substrate is made of glass and silicon, but may be made of any other material such as ceramics. Moreover, in the above embodiments the chip comprises four MR elements, but it may comprise at least two MR elements arranged one on the other. It should be noted that the magnetic sensor may be used as a reading head for reading information recorded on a magnetic record medium such as magnetic tapes and magnetic discs. Furthermore, in the above embodiments, the etching mask is formed by selectively projecting light upon the photoresist film via the photomask, but use may be made of a resist film which is harded by irradiation of an electron beam instead of light. In such a case the photomasks may be dispensed with.

As explained above in detail, in the method according to the invention, since the patterning of two MR elements arranged one on the other is carried out by a single etching treatment, the dimension and shape of the two MR elements can be made equal to each other precisely and thus, the magnetic property of the MR elements are also made identical with each other. Therefore, the accuracy of magnetic detection can be improved materially and the number of manufacturing steps can be made small. Moreover, prior to the deposition of the metal film, the side walls of the through-hole are coated with the insulating film, the short-circuit can be avoided effectively. In this case, when the insulating film is made of the insulating photoresist, the manufacturing process can be further made simple. Moreover, in the examples II and III, when the selective etching is carried out in combination with different kinds of insulating materials, the short-circuit via pin-holes can be effectively prevented. As shown in the example III, when the substrate is formed by silicon, the heat radiation property can be improved and therefore, a larger current may be flowed through the MR elements so as to obtain a detection output with high S/N. The silicon substrate has been widely used in the semiconductor field and thus, the silicon substrate of high quality can be easily available. Moreover, in the example III, since each of MR elements is sandwitched between the insulating films made of the same material, the magnetic property of MR elements can be further improved, so that the magnetic detection can be effected much more accurately.

What is claimed is:

1. A method of manufacturing a magnetic sensor including at least two magnetoresistive elements arranged one on the other via an insulating layer comprising the steps of:

depositing on a substrate at least a first magnetoresistive film, an insulating film and a second magnetoresistive film successively in this order;

applying a resist film on the second magnetoresistive film;

selectively removing the resist film in accordance with a given pattern of the magnetoresistive elements to be manufactured;

etching simultaneously the first and second magnetoresistive films and insulating film via the resist film to form first and second magnetoresistive elements arranged one on the other with the insulating film being interposed therebetween;

forming in said second magnetoresistive film and insulating film through-holes extending up to the first magnetoresistive film; and forming an electrical connection to the first magnetoresistive film by means of said through-holes.

2. A method according to claim 1, wherein said step of forming the electrical connection to the first magnetoresistive film comprises applying an insulating film on the second magnetoresistive film;

forming openings in the insulating film at a bottom of the through-holes;

depositing a metal film on the insulating film; and
selectively removing the metal film in accordance with a given pattern to form the electrical connection to the first magnetoresistive film.

3. A method according to claim 2, wherein further openings are simultaneously formed in the insulating film applied on the second magnetoresistive film at positions corresponding to electrical connection to the second magnetoresistive film.

4. A method according to claim 2, wherein said insulating film applied on the second magnetoresistive film is made of insulating resist.

5. A method according to claim 4, wherein said insulating resist is made of insulating photoresist.

6. A method according to claim 5, wherein said insulating photoresist is made of polyimide.

7. A method according to claim 1, wherein a second insulating film made of insulating material different from the first insulating film is applied on the second magnetoresistive film prior to the step of applying the resist film; the first and second magnetoresistive films and the first and second insulating films are partially removed by a single etching treatment; parts of the second insulating film are selectively removed by means of an etchant which selectively attacks the second insulating film, but does not attack the first insulating film to form openings, and an electrical connection to the second magnetoresistive film is formed via said openings.

8. A method according to claim 7, wherein said first and second insulating films are made of $Ta_2O_5$ and $SiO_2$, respectively.

9. A method according to claim 8, wherein said second insulating film made of $SiO_2$ is partially removed with a hydrofluoric acid etchant.

10. A method according to claim 2, wherein said metal film is formed by depositing a molybdenum layer and a gold layer successively.

11. A method according to claim 1, wherein said first and second magnetoresistive films and insulating film are simultaneously etched by means of a dry etching using a mixture gas of $CF_4$ gas, $CCl_4$ gas and $O_2$ gas.

12. A method according to claim 1, wherein said first and second magnetoresistive films and the insulating film are simultaneously etched by means of a wet etching using a hydrofluoric acid etchant and a mixed strong acid etchant.

13. A method according to claim 1, wherein said first and second magnetoresistive films and insulating film are simultaneously etched by means of a spatter etching in Ar gas.

14. A method according to claim 1, wherein a first insulating layer, a first magnetoresistive film, a second insulating film, a third insulating film, a second magnetoresistive film and a fourth magnetoresistive film are deposited on the substrate successively in this order; these six films are partially etched by a single etching treatment to form the first and second magnetoresistive elements simultaneously; through-holes are formed in said fourth insulating film, second magnetoresistive film and third insulating film at positions corresponding to the electrical connection to the first magnetoresistive element; a fifth insulating film is deposited on the fourth insulating film; openings are formed in the fifth insulating film at bottoms of the through-holes and at positions corresponding to an electrical connection to the second magnetoresistive element; through-holes are formed in the second and fourth insulating films through said openings to expose parts of the first and second magnetoresistive films; the metal film is deposited on the fifth insulating film; and the metal film is selectively removed to form the electrical connection to the first and second magnetoresistive elements.

15. A method according to claim 14, wherein said fifth insulating film is formed by an insulating resist film.

16. A method according to claim 15, wherein said insulating resist film is formed by an insulating photoresist film of polyimide.

17. A method according to claim 14, wherein said second and third insulating films are formed by different materials and said through-holes extending up to the second insulating film are formed by using a selective etchant which attacks the third insulating film, but does not attack the second insulating film.

18. A method according to claim 14, wherein said substrate is formed by a silicon substrate.

* * * * *